United States Patent
Lee et al.

(10) Patent No.: US 9,236,889 B2
(45) Date of Patent: Jan. 12, 2016

(54) APPARATUS AND METHOD FOR DECODING MAXIMUM A POSTERIORI

(71) Applicant: Electronics and Telecommunications Research Institute, Daejeon (KR)

(72) Inventors: Yong Ho Lee, Ulsan (KR); Deock Gil Oh, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 216 days.

(21) Appl. No.: 14/104,748

(22) Filed: Dec. 12, 2013

(65) Prior Publication Data

US 2014/0226766 A1 Aug. 14, 2014

(30) Foreign Application Priority Data

Feb. 14, 2013 (KR) .................. 10-2013-0015783

(51) Int. Cl.
| | |
|---|---|
| H03M 13/03 | (2006.01) |
| H03M 13/41 | (2006.01) |
| H04L 1/00 | (2006.01) |
| H03M 13/39 | (2006.01) |

(52) U.S. Cl.
CPC ...... *H03M 13/4107* (2013.01); *H03M 13/3905* (2013.01); *H03M 13/3922* (2013.01); *H04L 1/0052* (2013.01); *H04L 1/0055* (2013.01)

(58) Field of Classification Search
CPC .................. H03M 13/4107; H03M 13/3922; H03M 13/3905; H04L 1/0055
See application file for complete search history.

(56) References Cited

U.S. PATENT DOCUMENTS

| | | | | | |
|---|---|---|---|---|---|
| 4,583,078 | A | * | 4/1986 | Shenoy et al. | 341/51 |
| 4,748,626 | A | * | 5/1988 | Wong | 714/746 |
| 5,432,803 | A | * | 7/1995 | Liu et al. | 714/794 |
| 5,446,746 | A | * | 8/1995 | Park | 714/795 |
| 5,469,452 | A | * | 11/1995 | Zehavi | 714/792 |
| 5,970,104 | A | * | 10/1999 | Zhong et al. | 375/341 |
| 5,987,637 | A | * | 11/1999 | Thomas | 714/795 |
| 6,088,404 | A | * | 7/2000 | Jekal | 375/341 |
| 2006/0274861 | A1 | * | 12/2006 | Langenbach et al. | 375/341 |
| 2009/0231745 | A1 | * | 9/2009 | Venkataramani et al. | 360/39 |
| 2011/0066913 | A1 | * | 3/2011 | Kang et al. | 714/752 |

OTHER PUBLICATIONS

Hamid R. Sadjadpour, "Maximum a Posteriori Decoding Algorithms for Turbo Codes", in Digital Wireless Communication II, Proceedings of SPIE, vol. 4045, 2000.

* cited by examiner

*Primary Examiner* — Joseph D Torres
(74) *Attorney, Agent, or Firm* — Kile Park Reed & Houtteman PLLC

(57) ABSTRACT

A maximum a posteriori (MAP) decoding apparatus and method are provided, which select a path having a maximum value without calculating all path metrics by generating metric difference vectors based on generated tables, calculating metrics of a path formed through a combination of a state and a branch each having a maximum metric, and calculating an index and a metric of a current state to which a calculation value is to be applied based on a result of comparing a state metric difference vector and a branch metric difference vector.

19 Claims, 9 Drawing Sheets

FIG. 5

| Previous state | State Index | Metric |
|---|---|---|
| $S_{k-1,0}$ | 0 | $\alpha_{k-1,0}$ |
| $S_{k-1,1}$ | 1 | $\alpha_{k-1,1}$ |
| ⋮ | ⋮ | ⋮ |
| $S_{k-1,N-1}$ | N-1 | $\alpha_{k-1,N-1}$ |

| Current branch | Branch Index | Metric |
|---|---|---|
| $B_{k,0}$ | 0 | $\beta_{k,0}$ |
| $B_{k,1}$ | 1 | $\beta_{k,1}$ |
| ⋮ | ⋮ | ⋮ |
| $B_{k,M-1}$ | M-1 | $\beta_{k,M-1}$ |

| Current state | State Index | Metric |
|---|---|---|
| $S_{k,0}$ | 0 | $\alpha_{k,0}$ |
| $S_{k,1}$ | 1 | $\alpha_{k,1}$ |
| ⋮ | ⋮ | ⋮ |
| $S_{k,N-1}$ | N-1 | $\alpha_{k,N-1}$ |

FIG. 6

| Ordered State Table - $s_{i,j}$ | | | | |
|---|---|---|---|---|
| $s_{0,0}$ | $s_{0,1}$ | $s_{0,2}$ | ... | $s_{0,N-1}$ |
| $s_{1,0}$ | $s_{1,1}$ | $s_{1,2}$ | ... | $s_{1,N-1}$ |

| Ordered Branch Table – $b_{m,n}$ | | | | |
|---|---|---|---|---|
| $b_{0,0}$ | $b_{0,1}$ | $b_{0,2}$ | ... | $b_{0,M-1}$ |
| $b_{1,0}$ | $b_{1,1}$ | $b_{1,2}$ | ... | $b_{1,M-1}$ |

FIG. 7

| State Metric Difference Vector – $D_{S,x}$ ||||||
|---|---|---|---|---|---|
| $D_{S,0}$ | $D_{S,1}$ | $D_{S,2}$ | ... | $D_{S,N-2}$ |

| Branch Metric Difference Vector – $D_{B,y}$ ||||||
|---|---|---|---|---|---|
| $D_{B,0}$ | $D_{B,1}$ | $D_{B,2}$ | ... | $D_{B,M-2}$ |

APPARATUS AND METHOD FOR DECODING MAXIMUM A POSTERIORI

CROSS-REFERENCE TO RELATED APPLICATION

This application claims the benefit of Korean Patent Application No. 10-2013-0015783, filed on Feb. 14, 2013, in the Korean Intellectual Property Office, the disclosure of which is incorporated herein by reference.

BACKGROUND

1. Field of the Invention

The present invention relates to a maximum a posteriori (MAP) decoding apparatus and method for efficiently selecting a surviving path.

2. Description of the Related Art

In long distance communication, a maximum likelihood (ML) transceiving device is used as an optimal method for detecting a received signal.

When an ML receiving device allocates a plurality of of bits per symbol in consideration of a length of transmission sequence and high efficiency transmission, it is almost impractical to implement such an ML receiving device since hardware complexity and a calculation amount are increased non-linearly.

A maximum a posteriori (MAP) decoding apparatus calculates all metrics of paths connected to individual state nodes per trellis section. Since the calculation is performed in both directions, that is, forward and backward, complexity may be further increased.

To reduce the complexity in the MAP decoding apparatus, a Log MAP method and a Max-Log MAP decoding method have been introduced. The Max-Log MAP decoding apparatus calculates all metrics of paths connected to individual state nodes per trellis section and then reflects a path having a maximum value to a next trellis section.

Although the complexity is relatively reduced in the Max-Log decoding apparatus, since calculation of the all metrics of the paths connected to the state nodes per trellis section is still performed, the complexity matter still remains unsatisfactory.

SUMMARY

An aspect of the present invention provides a maximum a posteriori (MAP) decoding apparatus including a table generation unit to generate a state table and a branch table, a metric difference vector generation unit to generate a state metric difference vector based on state table and generate a branch metric difference vector based on the branch table, a first calculation unit to calculate a metric of a path formed through a combination of a state and a branch each having a maximum metric, a comparison unit to compare the state metric difference vector with the branch metric difference vector, a second calculation unit to calculate an index value and a metric of a current state to which a calculation value is to be applied through an increase of an index value of the branch metric difference vector according to a result of the comparison, and a third calculation unit to calculate the index value and the metric of the current state to which a calculation value is to be applied through an increase of an index value of the state metric difference vector according to a result of the comparison.

The MAP decoding apparatus may further include a storage unit to store an index value and a metric of a current state calculated by reflecting a result of the calculation by the second calculation unit and the third calculation unit.

The table generation unit may store metrics corresponding to individual states during a trellis section in a decreasing order in a second row of the state table, and stores state index values of states including the metrics stored in the second row in a first row of the state table.

The table generation unit may store metrics corresponding to individual branches during the trellis section in a decreasing order in a second row of the branch table, and stores branch index values of branches having the metrics stored in the second row in a first row of the branch table.

The table generation unit may initialize all index values to zero per trellis section.

The metric difference vector generation unit may generate the state metric difference vector using a difference in elements of a second row of the state table during a trellis section.

The metric difference vector generation unit may generate the branch metric difference vector using a difference between elements of a second row of the branch table during the trellis section.

The metric difference vector generation unit may initialize all index values per trellis section.

The second calculation unit may increase the index value of the branch metric difference vector and calculate the index value and the metric of the current state when the branch metric difference vector is smaller than the state metric difference vector.

The third calculation unit may increase the index value of the state metric difference vector and calculate the index value and the metric of the current state when the state metric difference vector is smaller than the branch metric difference vector.

The second calculation unit and the third calculation unit may be both operated when the state metric difference vector and the branch metric difference vector are equal.

According to another aspect of the present invention, there is provided a MAP decoding method including generating a state table and a branch table, generating a state-metric difference vector based on state table, generating a branch metric difference vector based on the branch table, calculating a metric of a path formed through a combination of a state and a branch each having a maximum metric, comparing the state metric difference vector with the branch metric difference vector, calculating an index value and a metric of a current state to which a calculation value is to be applied through an increase of an index value of the branch metric difference vector according to a result of the comparison, and calculating the index value and the metric of the current state to which a calculation value is to be applied through an increase of an index value of the state metric difference vector according to a result of the comparison.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which:

FIG. 5 is a diagram illustrating an example of a system model according to an embodiment of the present invention;

FIG. 6 is a diagram illustrating an example of an ordered table according to an embodiment of the present invention;

FIG. 7 is a diagram illustrating an example of a state metric difference vector and a branch metric difference vector according to an embodiment of the present invention;

DETAILED DESCRIPTION

Figure 1:
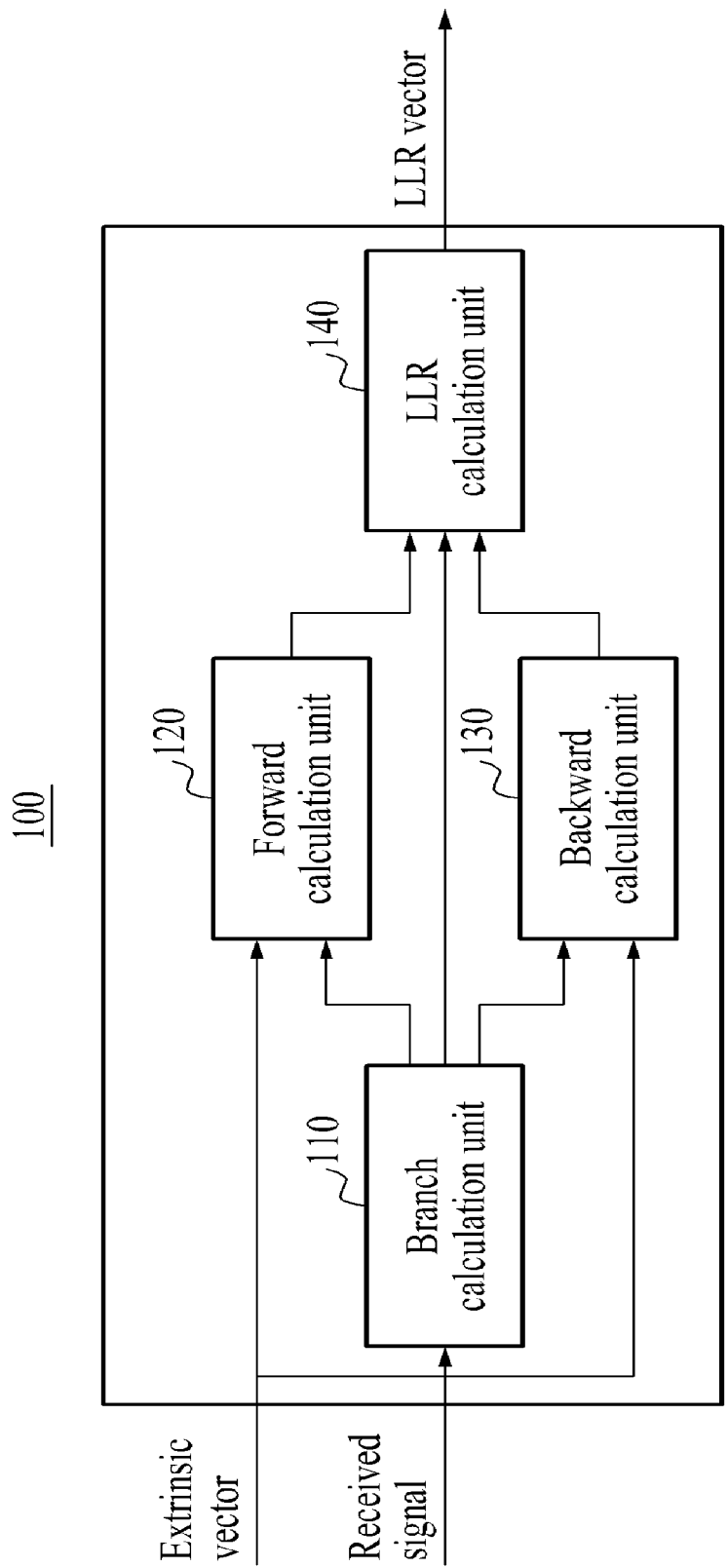
FIG. 1 is a block diagram illustrating a maximum a posteriori (MAP) decoding apparatus according to an embodiment of the present invention.

Reference will now be made in detail to exemplary embodiments of the present invention, examples of which are illustrated in the accompanying drawings, wherein like reference numerals refer to the like elements throughout.

In the description of the present invention, if detailed descriptions of related disclosed art or configuration are determined to unnecessarily make the subject matter of the present invention obscure, they will be omitted. Terms to be used below are defined based on their functions in the present invention and may vary according to users, user's intentions, or practices. Therefore, the definitions of the terms should be determined based on the entire specification.

A maximum a posteriori (MAP) decoding apparatus may order a state metric and a branch metric input per trellis section and combine the state metric and the branch metric according to a predetermined rule, thereby efficiently selecting a path having a maximum value without the necessity of calculating all path metrics.

The MAP decoding apparatus according to an embodiment of the present invention may be applied to a decoding apparatus of which complexity is non-linearly increased due to a plurality of states and branches.

FIG. 1 is a block diagram illustrating a MAP decoding apparatus 100 according to an embodiment of the present invention.

Referring to FIG. 1, the MAP decoding apparatus 100 includes a branch calculation unit 110, a forward calculation unit 120, a backward calculation unit 130, and a log likelihood ratio (LLR) calculation unit 140. The MAP decoding apparatus 100 may receive an input of a received signal for detection and an extrinsic vector and accordingly output an LLR vector.

Figure 2:
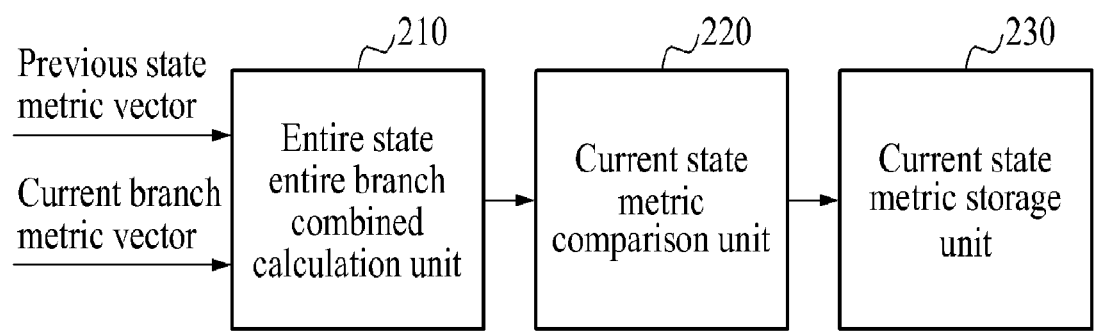
FIG. 2 is a block diagram illustrating a forward calculation unit according to an embodiment of the present invention.
Figure 3:
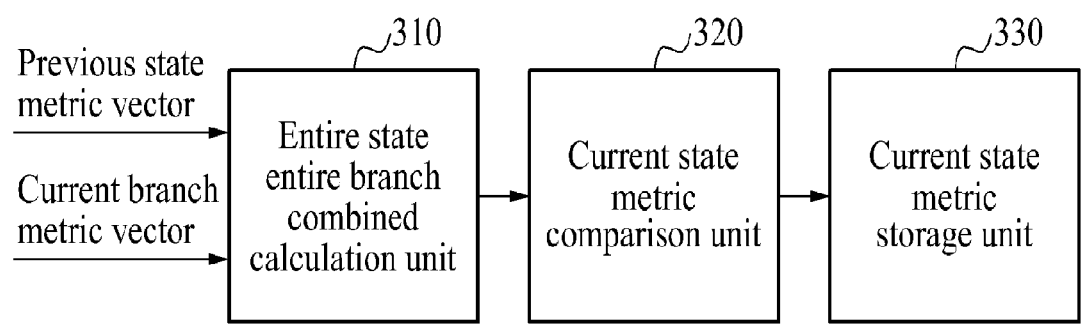
FIG. 3 is a block diagram illustrating a backward calculation unit according to an embodiment of the present invention.

FIG. 2 is a block diagram illustrating a forward calculation unit according to an embodiment of the present invention. FIG. 3 is a block diagram illustrating a backward calculation unit according to an embodiment of the present invention.

As shown in FIGS. 2 and 3, the MAP decoding apparatus according to the embodiment of the present invention may include a forward calculation unit and a backward calculation unit.

The forward calculation unit may include an entire state entire branch combined calculation unit 210, a current state metric comparison unit 220, and a current state metric storage unit 230. The backward calculation unit may include an entire state entire branch combined calculation unit 310, a previous state metric comparison unit 320, and a previous state metric storage unit 330.

The MAP decoding apparatus may apply a maximum log MAP decoding method and perform log-based path metric calculation. The MAP decoding apparatus may reflect a path having a maximum value among paths connected to individual state nodes to a next trellis section.

Figure 4:
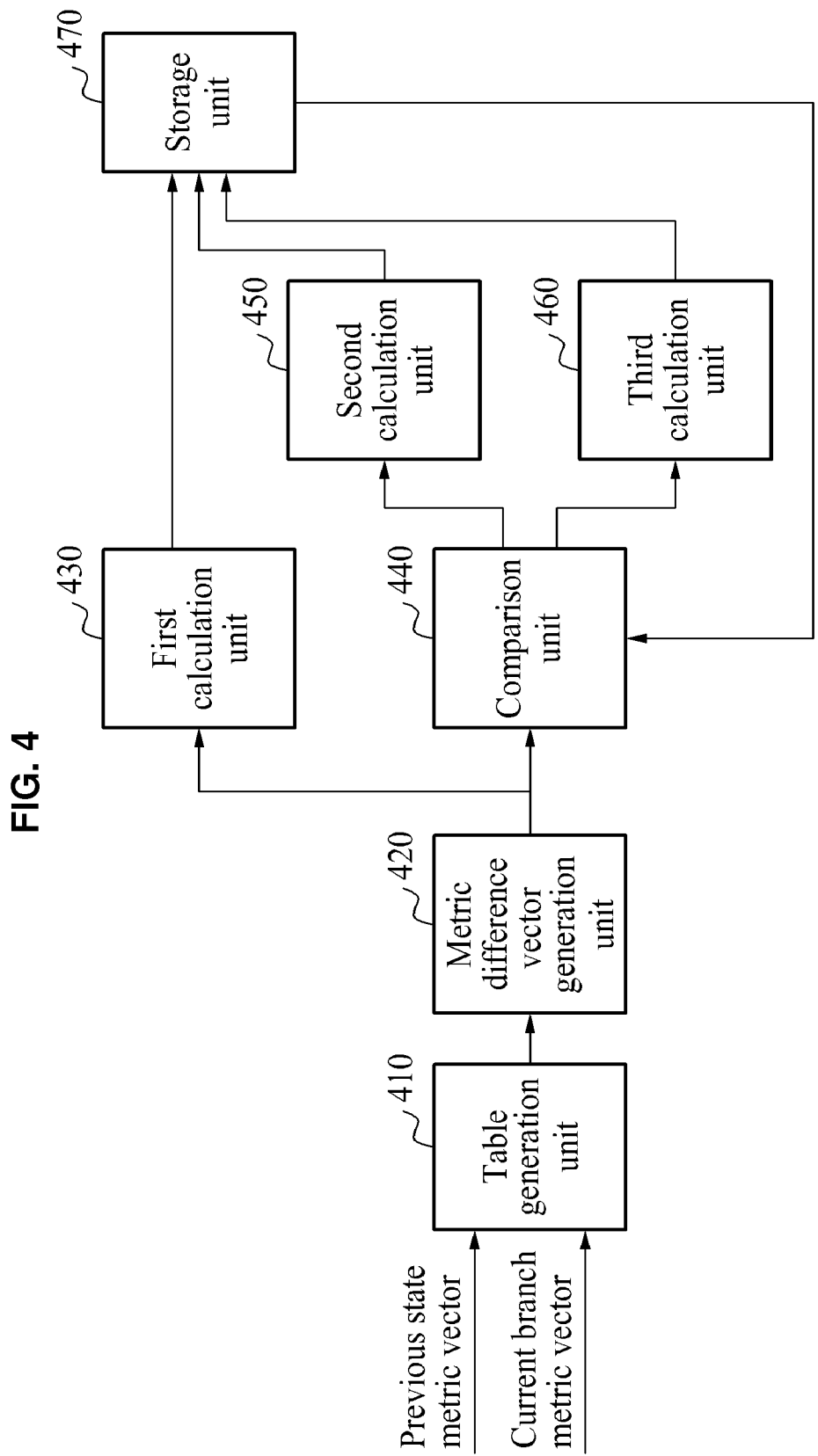
FIG. 4 is a block diagram illustrating a configuration of a MAP decoding apparatus according to another embodiment of the present invention.

FIG. 4 is a block diagram illustrating a configuration of a MAP decoding apparatus according to another embodiment of the present invention.

Referring to FIG. 4, the MAP decoding apparatus according to the embodiment includes a table generation unit 410, a metric difference vector generation unit 420, a first calculation unit 430, a comparison unit 440, a second calculation unit 450, and a third calculation unit 460. The MAP decoding apparatus may further include a storage unit 470.

The MAP decoding apparatus may be applied to a random k-th trellis section with reference to one received signal, and may provide an internal calculation process to efficiently select a surviving path. Also, the MAP decoding apparatus may apply a final output value and an input and output signal interface in a same manner as max-log MAP decoding.

The table generation unit 410 may receive a previous state metric vector and a current branch metric vector, thereby generating a state table and a branch table.

For example, the table generation unit 410 may store metrics corresponding to individual states during a trellis section in a decreasing order in a second row of the state table. The table generation unit 410 may store state index values of states having the metrics stored in the second row, in a first row of the state table. In addition, the table generation unit 410 may initialize every index value to zero per the trellis section.

As another example, the table generation unit 410 may store metrics corresponding to individual branches during the trellis section in a decreasing order in a second row of the branch table, and store branch index values of branches having the metrics stored in the second row in a first row of the branch table. In addition, the table generation unit 410 may initialize every index value to zero per the trellis section.

The metric difference vector generation unit 420 may generate a state metric difference vector based on the state table, and a branch metric difference vector based on the branch table.

For example, the metric difference vector generation unit 420 may generate the state metric difference vector using a difference between elements of the second row of the state table during the trellis section. The metric difference vector generation unit 420 may generate the branch metric difference vector using a difference between elements of the second row of the branch table during the trellis section.

Here, the metric difference vector generation unit 420 may initialize all index values to zero per every trellis section.

The first calculation unit generation unit 430 may calculate a metric of a path formed through a combination of a state having a maximum metric and a branch having a maximum metric. For example, the first calculation unit 430 may calculate the metric of the path forming a maximum state and a maximum branch.

The comparison unit 440 may compare the state metric difference vector to the branch metric difference vector.

According to the comparison result of the comparison unit 440, the second calculation unit 450 may calculate an index value and a metric of the current state to which a calculation value is to be applied through an increase of an index value of the branch metric difference vector. According to the comparison result of the comparison unit 440, the third calculation unit 460 may calculate an index value and a metric of a current state to which a calculation value is to be applied through an increase in an index value of the state metric difference vector.

For example, when the branch metric difference vector is smaller than the state metric difference vector, the second calculation unit 450 may increase the index value of the branch metric difference vector and calculate the index value and the metric of the current state.

As another example, when the state metric difference vector is smaller than the branch metric difference vector, the third calculation unit 460 may increase the state metric difference vector and calculate the index value and the metric of the current state.

As yet another example, the second calculation unit 450 and the third calculation unit 460 may both be operated when the state metric difference vector and the branch metric difference vector are equal.

The storage unit 470 may store the current state index value and the metric reflecting a calculation result of the second calculation unit 450 and the third calculation unit 460.

A system model of the MAP decoding apparatus may be defined as follows for understanding of the embodiments of the present invention. However, the scope of the present invention is not limited to the following model, but system modeling may be variably modified according to intentions of designers. Here, a variable N may correspond to a number of states while a variable M may correspond to a number of branches.

FIG. 5 is a diagram illustrating an example of a system model according to an embodiment of the present invention.
FIG. 6 is a diagram illustrating an example of an ordered table according to an embodiment of the present invention.

Referring to FIGS. 5 and 6, a MAP decoding apparatus may generate two types of ordered table during a random k-th trellis section.

For example, the MAP decoding apparatus may order and store metrics corresponding to individual states in a decreasing order from a second row $s_{1,0}$ of a state table which is a first table. Here, a first row $s_{0,j}$ may store a state index value of a state having a second row $s_{1,j}$ as the metric.

As another example, the MAP decoding apparatus may order metrics corresponding to individual branches in a decreasing order from a second row $b_{1,0}$ of a branch table which is a second table. Here, a first row $b_{0,n}$ may store a branch index value of a branch having a second row $b_{1,n}$ as the metric.

According to an aspect of the present invention, the MAP decoding apparatus may initialize all relevant indexes i, j, m, and n to zero per trellis section.

The MAP decoding apparatus may generate two types of the metric difference vector during the random k-th trellis section.

For example, the MAP decoding apparatus may generate a state metric difference vector which is a first vector using a difference between elements of the second row of the state table.

As another example, the MAP decoding apparatus may generate a branch metric difference vector which is a second vector using a difference between elements of the second row of the branch table.

According to an aspect of the present invention, the MAP decoding apparatus may initialize all relevant indexes x and y to zero per trellis section.

FIG. 7 is a diagram illustrating an example of a state metric difference vector and a branch metric difference vector according to an embodiment of the present invention.

Referring to FIG. 7, the state metric difference vector $D_{S,x}$ and the branch metric difference vector $D_{B,y}$ may be expressed by Equation 1.

$$D_{S,x} = s_{1,0} - s_{1,x+1}$$

$$D_{B,y} = b_{1,0} - b_{1,y+1} \quad \text{[Equation 1]}$$

The MAP decoding apparatus may calculate the metric of a path formed through a combination of a state and a branch respectively having a maximum metric during the random k-th trellis section, using a maximum state maximum branch calculation unit which is the first calculation unit.

The first calculation unit may calculate an index p of and a metric $\alpha_{k,p}$ of a current state to which a calculation value is to be applied, and transmit the index p and the metric $\alpha_{k,p}$ to the storage unit, as shown in Equation 2 below.

$$p = (s_{0,0} + b_{0,0}) \% N$$

$$\alpha_{k,p} = s_{1,0} + b_{1,0} \quad \text{[Equation 2]}$$

As shown in FIG. 7, the MAP decoding apparatus may compare $D_{S,x}$ and $D_{B,y}$ being input, and operate the second calculation unit corresponding to a max branch less state calculation unit when $D_{S,x}$ is smaller than $D_{B,y}$, or operate the third calculation unit corresponding to a max state less branch calculation unit when $D_{B,y}$ is smaller than $D_{S,x}$. Also, the MAP decoding apparatus may operate both calculation units when the compared values are equal.

When an index x is approximated and exceeded before comparison of $D_{S,x}$ and $D_{B,y}$, the MAP decoding apparatus may operate the third calculation unit and transmit a control signal so that the third calculation unit performs separate calculation instead of conventionally performed calculation. When an index y is approximated and exceeded, the MAP decoding apparatus may operate the second calculation unit and transmit a control signal so that the second calculation unit performs separate calculation instead of conventionally performed calculation.

For example, the MAP decoding apparatus may perform following calculations sequentially using the third calculation unit during the random k-th trellis section.

As shown in Equation 3 below, the MAP decoding apparatus may increase the index x of the state metric difference vector by 1 and calculate an index p of the current state to which a calculation value is to be applied.

Here, when the calculated index p is not redundant with an index p stored in the storage unit, the third calculation unit may calculate a metric $\alpha_{k,p}$ and transmit the index p and the metric $\alpha_{k,p}$ to the storage unit. When the calculated index p is redundant with the stored index p, the third calculation unit may omit calculation of $\alpha_{k,p}$ and transmit nothing to the storage unit.

$$x = x + 1$$

$$p = (s_{0,x} + b_{0,n}) \% N$$

$$\alpha_{k,p} = s_{1,x} + b_{1,n} \quad \text{[Equation 3]}$$

In addition, the third calculation unit may perform separate calculation according to the control signal received from the comparison unit.

As shown in Equation 4 below, when an index p calculated by the same process as described above is not redundant with the index p stored in the storage unit, the third calculation unit may calculate a metric $\alpha_{k,p}$ and transmit the index p and the metric $\alpha_{k,p}$ to the storage unit. When the calculated index p is redundant with the stored index p, the third calculation unit may omit calculation of the metric $\alpha_{k,p}$ and transmit nothing to the storage unit.

$$x=x+1$$

$$p=(s_{0,x}+b_{0,0})\% N$$

$$\alpha_{k,p}=s_{1,x}+b_{1,0} \quad \text{[Equation 4]}$$

As another example, the MAP decoding apparatus may perform following calculations sequentially using the second calculation unit during the random k-th trellis section.

As shown in Equation 5, the MAP decoding apparatus may increase the index x of the branch metric difference vector by 1 and calculate an index p of the current state to which a calculation value is to be applied.

Here, when the calculated index p is not redundant with the index p stored in the storage unit, the second calculation unit may calculate the metric $\alpha_{k,p}$ and transmit the index p and the metric $\alpha_{k,p}$ to the storage unit. When the calculated index p is redundant with the stored index p, the second calculation unit may omit calculation of $\alpha_{k,p}$ and transmit nothing to the storage unit.

$$y=y+1$$

$$p=(s_{0,y}+b_{0,y})\% N$$

$$\alpha_{k,p}=s_{1,y}+b_{1,y} \quad \text{[Equation 5]}$$

In addition, the second calculation unit may perform separate calculation according to the control signal received from the comparison unit.

As shown in Equation 6, when an index p calculated by the same process as described above is not redundant with the index p stored in the storage unit, the second calculation unit may calculate the metric $\alpha_{k,p}$ and transmit the index p and the metric metric $\alpha_{k,p}$ to the storage unit. When the calculated index p is redundant with the stored index p, the second calculation unit may omit calculation of the metric $\alpha_{k,p}$ and transmit nothing to the storage unit.

$$y=y+1$$

$$p=(s_{0,0}+b_{0,y})\% N$$

$$\alpha_{k,p}=s_{1,0}+b_{1,y} \quad \text{[Equation 6]}$$

The MAP decoding apparatus may store the index p and the metric $\alpha_{k,p}$, calculated by the second calculation unit and the third calculation unit during the random k-th trellis section, in the storage unit, and determine whether the current state metric is completed.

When the current state metric is not completed, the MAP decoding apparatus may repeat the comparison by the comparison unit until the current state metric is completed. When the current state metric is completed, the MAP decoding apparatus may end selecting of a surviving path with respect to the random k-th trellis section.

Figure 8:
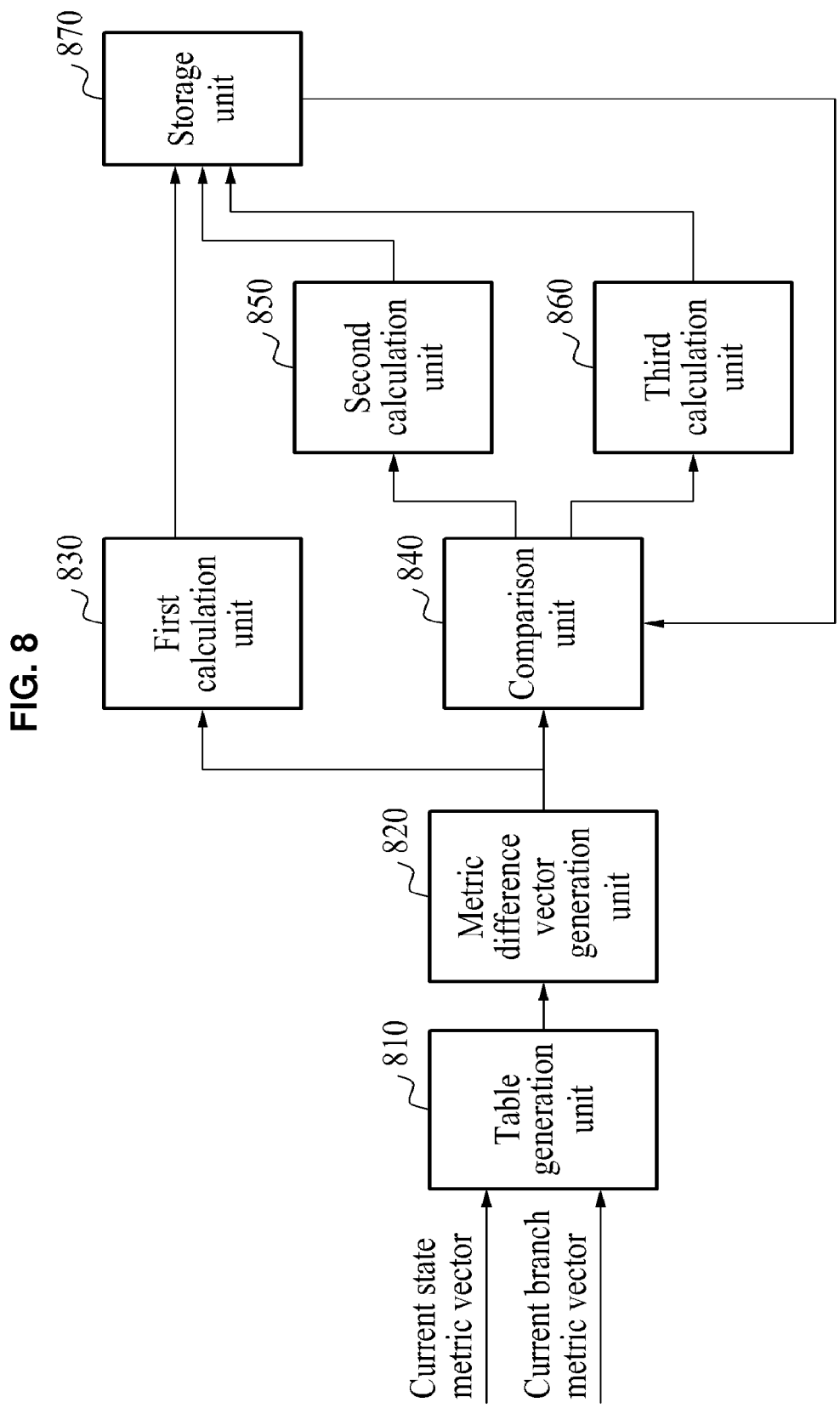
FIG. 8 is a block diagram illustrating a configuration of a MAP decoding apparatus according to still another embodiment of the present invention.

FIG. 8 is a block diagram illustrating a configuration of a MAP decoding apparatus according to still another embodiment of the present invention.

Referring to FIG. 8, the MAP decoding apparatus includes a table generation unit 810, a metric difference vector generation unit 820, a first calculation unit 830, a comparison unit 840, a second calculation unit 850, a third calculation unit 860, and a storage unit 870.

The MAP decoding apparatus may generate a state table and a branch table by receiving a current state metric vector and a current branch metric vector. The MAP decoding apparatus may be applied to a random k-th trellis section with reference to one received signal.

The MAP decoding apparatus may provide an internal calculation process to efficiently select a surviving path. Also, the MAP decoding apparatus may apply a final output value and an input and output signal interface in a same manner as max-log MAP decoding.

Figure 9:
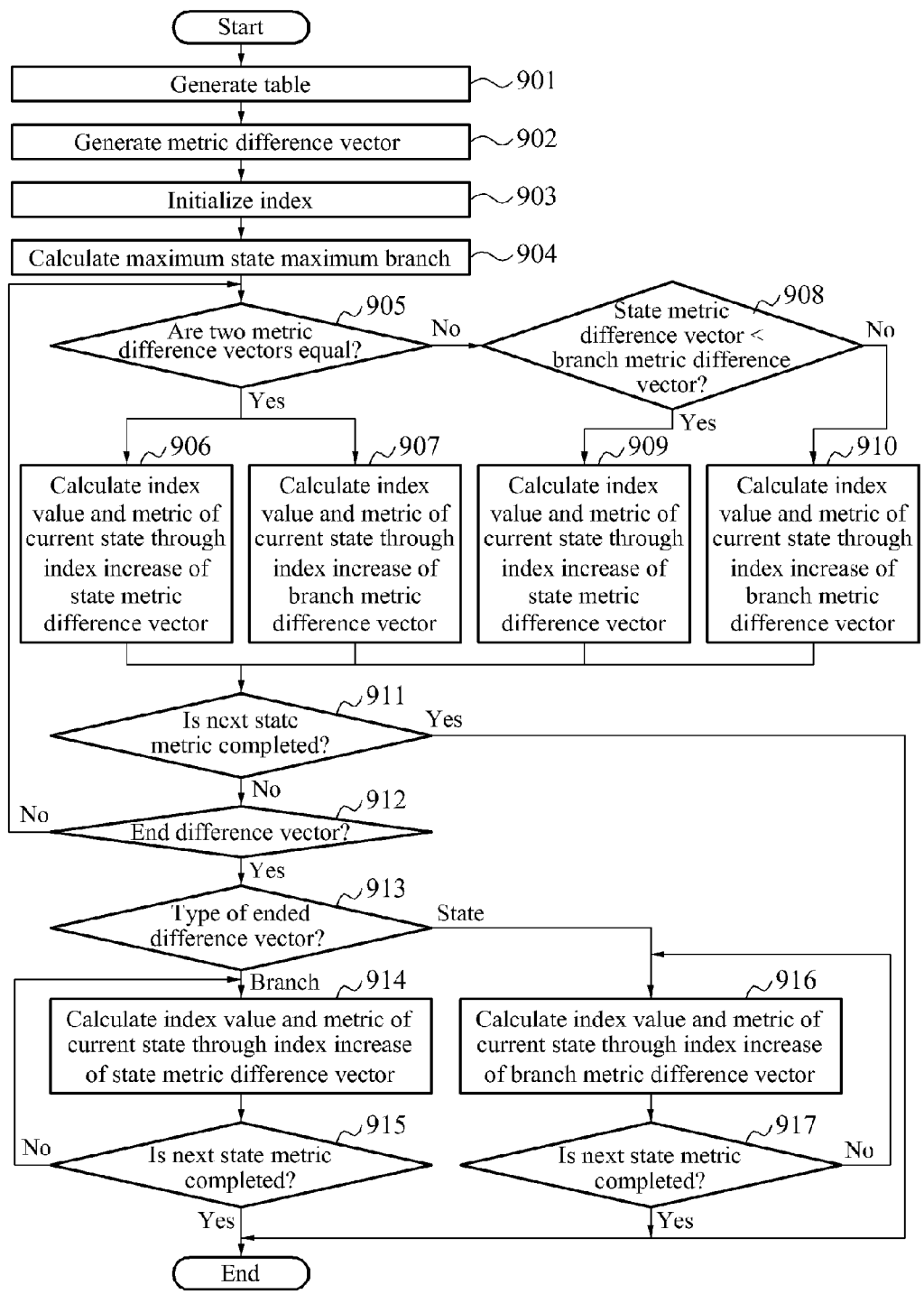
FIG. 9 is a flowchart illustrating a MAP decoding method according to an embodiment of the present invention.

FIG. 9 is a flowchart illustrating a MAP decoding method according to an embodiment of the present invention.

Referring to FIG. 9, the MAP decoding apparatus may generate a state table and a branch table in operation 901, and generate metric difference vectors based on the state table and the branch table, respectively, in operation 902. Here, in operation 903, the MAP decoding apparatus may initialize all indexes to zero per trellis section.

In operation 904, the MAP decoding apparatus may calculate a metric of a path formed through a combination of a state and a branch respectively having a maximum metric. In operation 905, the MAP decoding apparatus may compare a state metric difference vector and a branch metric difference vector.

When the state metric difference vector and the branch metric difference vector are equal, the MAP decoding apparatus may simultaneously perform calculation 906 of an index and a metric of the current state based on the third calculation unit and calculation 907 of an index and a metric of the current state based on the second calculation unit.

When the two metric difference vectors are not equal as a result of the comparison, the MAP decoding apparatus may compare the state metric difference vector and the branch metric difference vector to each other in operation 908.

When the state metric difference vector is smaller than the branch metric difference vector as a result of the comparison, the MAP decoding apparatus may increase the index value of the state metric difference vector and calculate the index value and the metric of the current state in operation 909.

When the branch metric difference vector is smaller than the state metric difference vector, the MAP decoding apparatus may increase the index value of the branch metric difference vector and calculate the index value and the metric of the current state in operation 910.

After calculation of the index value is completed, the MAP decoding apparatus may determine whether a next state metric is completed in operation 911. When the next state metric is completed, the MAP decoding apparatus may finally select a surviving path with respect to the corresponding trellis section and end the operation.

When the next state metric is not completed, the MAP decoding apparatus may determine whether the metric difference vector is ended in operation 912, and determine a type of the metric difference vector in operation 913 when the metric difference vector is ended.

For example, when the type of the metric difference vector is the branch metric difference vector, the MAP decoding apparatus may calculate the index value and the metric of the current state based on the third calculation unit in operation 914, and determine whether the next state metric is completed in operation 915.

As another example, when the type of the metric difference vector is the state metric difference vector, the MAP decoding apparatus may calculate the index value and the metric of the current state based on the second calculation unit in operation 916, and determine again whether the next state metric is completed in operation 917.

A MAP decoding method according to an embodiment of the present invention may efficiently select a path having a maximum value without calculating metrics of all paths in calculation according to the maximum log MAP decoding. Accordingly, complexity of calculation may be decreased.

The MAP decoding apparatus according to embodiments of the present invention is applicable to various types of the maximum log MAP decoding apparatus, not limited to a particular maximum log MAP decoding apparatus. In particular, the MAP decoding apparatus may be applied to a decoding apparatus of which complexity is non-linearly increased due to a plurality of states and branches.

According to the embodiments, in a max-log MAP decoding apparatus, a surviving path may be efficiently selected without the necessity of calculating all path metrics per trellis section.

According to the embodiments, complexity of the decoding calculation may be reduced.

According to the embodiments, a decoding method applicable to a max-log MAP decoding apparatus and to a decoding apparatus of which complexity is non-linearly increased due to a plurality of states and branches may be provided.

The above-described embodiments of the present invention may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A maximum a posteriori (MAP) decoding apparatus comprising:
   a table generation unit to generate a state table and a branch table;
   a metric difference vector generation unit to generate a state metric difference vector based on state table and generate a branch metric difference vector based on the branch table;
   a first calculation unit to calculate a metric of a path formed through a combination of a state and a branch each having a maximum metric;
   a comparison unit to compare the state metric difference vector with the branch metric difference vector;
   a second calculation unit to calculate an index value and a metric of a current state to which a calculation value is to be applied through an increase of an index value of the branch metric difference vector according to a result of the comparison; and
   a third calculation unit to calculate the index value and the metric of the current state to which a calculation value is to be applied through an increase of an index value of the state metric difference vector according to a result of the comparison.

2. The MAP decoding apparatus of claim 1, further comprising:
   a storage unit to store an index value and a metric of a current state calculated by reflecting a result of the calculation by the second calculation unit and the third calculation unit.

3. The MAP decoding apparatus of claim 1, wherein the table generation unit stores metrics corresponding to individual states during a trellis section in a decreasing order in a second row of the state table, and stores state index values of states including the metrics stored in the second row in a first row of the state table.

4. The MAP decoding apparatus of claim 3, wherein the table generation unit initializes all index values to zero per trellis section.

5. The MAP decoding apparatus of claim 1, wherein the table generation unit stores metrics corresponding to individual branches during the trellis section in a decreasing order in a second row of the branch table, and stores branch index values of branches having the metrics stored in the second row in a first row of the branch table.

6. The MAP decoding apparatus of claim 1, wherein the metric difference vector generation unit generates the state metric difference vector using a difference in elements of a second row of the state table during a trellis section.

7. The MAP decoding apparatus of claim 6, wherein the metric difference vector generation unit initializes all index values per trellis section.

8. The MAP decoding apparatus of claim 1, wherein the metric difference vector generation unit generates the branch metric difference vector using a difference between elements of a second row of the branch table during the trellis section.

9. The MAP decoding apparatus of claim 1, wherein the third calculation unit increases the index value of the state metric difference vector and calculates the index value and the metric of the current state when the state metric difference vector is smaller than the branch metric difference vector.

10. The MAP decoding apparatus of claim 1, wherein the second calculation unit increases the index value of the branch metric difference vector and calculates the index value and the metric of the current state when the branch metric difference vector is smaller than the state metric difference vector.

11. The MAP decoding apparatus of claim 1, wherein the second calculation unit and the third calculation unit are both operated when the state metric difference vector and the branch metric difference vector are equal.

12. A maximum a posteriori (MAP) decoding method comprising:
   generating a state table and a branch table;
   generating a state metric difference vector based on state table;
   generating a branch metric difference vector based on the branch table;
   calculating a metric of a path formed through a combination of a state and a branch each having a maximum metric;

comparing the state metric difference vector with the branch metric difference vector;

calculating an index value and a metric of a current state to which a calculation value is to be applied through an increase of an index value of the branch metric difference vector according to a result of the comparison; and calculating the index value and the metric of the current state to which a calculation value is to be applied through an increase of an index value of the state metric difference vector according to a result of the comparison.

13. The MAP decoding method of claim 12, wherein the generating of the state table and the branch table comprises:

storing metrics corresponding to individual states during a trellis section in a decreasing order in a second row of the state table;

storing state index values of states including the metrics stored in the second row in a first row of the state table; and initializing all index values to zero per trellis section.

14. The MAP decoding method of claim 12, wherein the generating of the state table and the branch table comprises:

storing metrics corresponding to individual branches during a trellis section in a decreasing order in a second row of the branch table, and storing branch index values of branches including the metrics stored in the second row in a first row of the branch table; and initializing all index values to zero per trellis section.

15. The MAP decoding method of claim 12, wherein the generating of the state metric difference vector comprises:

generating the state metric difference vector using a difference between elements of a second row of the state table during a trellis section; and initializing all index values to zero per trellis section.

16. The MAP decoding method of claim 12, wherein the generating of the branch metric difference vector comprises:

generating the branch metric difference vector using a difference between elements of a second row of the branch table during a trellis section; and initializing all index values to zero per trellis section.

17. The MAP decoding method of claim 12, wherein the calculating of the index value and the metric of the current state comprises:

increasing an index value of the state metric difference vector and calculating the index and the metric of the current state when the state metric difference vector is smaller than the branch metric difference vector.

18. The MAP decoding method of claim 12, wherein the calculating of the index value and the metric of the current state comprises:

increasing an index value of the branch metric difference vector and calculating the index and the metric of the current state when the branch metric difference vector is smaller than the state metric difference vector.

19. The MAP decoding method of claim 12, wherein the calculating of the index value of the state metric difference vector and the calculating of the index value of the branch metric difference vector are simultaneously performed when the state metric difference vector and the branch metric difference vector are equal.

\* \* \* \* \*